(12) United States Patent
Hegde et al.

(10) Patent No.: US 7,091,568 B2
(45) Date of Patent: Aug. 15, 2006

(54) ELECTRONIC DEVICE INCLUDING DIELECTRIC LAYER, AND A PROCESS FOR FORMING THE ELECTRONIC DEVICE

(75) Inventors: Rama I. Hegde, Austin, TX (US); Alexander A. Demkov, Austin, TX (US); Philip J. Tobin, Austin, TX (US); Dina H. Triyoso, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/023,014

(22) Filed: Dec. 22, 2004

(65) Prior Publication Data

US 2006/0131671 A1 Jun. 22, 2006

(51) Int. Cl.
*H01L 29/76* (2006.01)
*H01L 21/8242* (2006.01)

(52) U.S. Cl. ............ 257/410; 257/761; 438/240; 438/287

(58) Field of Classification Search ............ 257/406, 257/410, 761; 438/3, 240, 283, 287
See application file for complete search history.

(56) References Cited

U.S. PATENT DOCUMENTS

| | | | |
|---|---|---|---|
| 5,810,923 A | 9/1998 | Yano et al. | |
| 5,828,080 A | 10/1998 | Yano et al. | |
| 5,844,849 A | 12/1998 | Furutani | |
| 6,552,403 B1 | 4/2003 | Lucovsky | |
| 6,686,264 B1 | 2/2004 | Lucovsky | |
| 6,724,648 B1 | 4/2004 | Khellah et al. | |
| 6,894,353 B1* | 5/2005 | Samavedam et al. | 257/365 |
| 2001/0023120 A1 | 9/2001 | Tsunashima et al. | |
| 2002/0024108 A1 | 2/2002 | Lucovsky et al. | |
| 2003/0139026 A1 | 7/2003 | Lucovsky | |
| 2004/0023461 A1 | 2/2004 | Ahn et al. | |
| 2005/0148127 A1* | 7/2005 | Jung et al. | 438/197 |

FOREIGN PATENT DOCUMENTS

EP 1179837 2/2002

OTHER PUBLICATIONS

U.S. Department of Energy, "Aluminum Project Fact Sheet: In-Situ Grain Refinement Process for Aluminum," Office of Industrial Technologies, Energy Efficiency and Renewable Energy, Washington, DC, Apr. 2001.

(Continued)

*Primary Examiner*—Hsien-Ming Lee (57) ABSTRACT

A mixture of materials can be used within a layer of an electronic device to improve electrical and physical properties of the layer. In one set of embodiments, the layer can be a dielectric layer, such as a gate dielectric layer or a capacitor dielectric layer. The dielectric layer can include O, and two or more dissimilar metallic elements. In one specific embodiment, two dissimilar elements may have the same single oxidation state and be miscible within each other. In one embodiment, the dielectric layer can include an alloy of $(HfO_2)_{(1-x)}(ZrO_2)_x$, wherein x is between 0 and 1. Each of Hf and Zr has a single oxidation state of +4. Other combinations are possible. Improved electrical and physical properties can include better control over grain size, distribution of grain sizes, thickness of the layer across a substrate, improved carrier mobility, threshold voltage stability, or any combination thereof.

20 Claims, 2 Drawing Sheets

OTHER PUBLICATIONS

Kim, H.D., et al., "Characteristics of high-k gate dielectric formed by the oxidation of sputtered Hf/Zr/Hf thin films on the Si substrate," J. Vac. Sci. Technol. A 22(4), pp. 1342-1346, Jul./Aug. 2004.

Kim, Hyongsub, et al., "Microstructural evolution of $ZrO_2$-$HfO_2$ nanolaminate structures grown by atomic layer deposition," J. Mater. Res., vol. 19, No. 2, pp. 643-650, Feb. 2004.

T. Li, et al., "Integration Processes and Properties of Pt/$Pb_5Ge_3O_{11}$/(Zr, Hf) $O_2$/Si One Transistor Memory Devices," Mat. Res. Soc. Symp. Proc., vol. 688, pp. 371-376, 2002.

Lucovsky, G., "Integration of alternative high-k gate dielectrics into aggressively scaled CMOS Si devices: Chemical bonding constraints at Si-dielectric interfaces," Electrochemical Society Proceedings, vol. 99-10, pp. 69-80.

Lucovsky, G., "Microscopic model for enhanced dielectric constants in low concentration $SiO_2$-rich noncrystalline Zr and Hf silicate alloys," APL, vol. 77, pp. 2912-2914, 2000.

* cited by examiner

ELECTRONIC DEVICE INCLUDING DIELECTRIC LAYER, AND A PROCESS FOR FORMING THE ELECTRONIC DEVICE

BACKGROUND

1. Field of the Disclosure

The present disclosure relates to dielectric layers, electronic devices, and processes, and more particularly to a dielectric layer including a metallic oxide, an electronic device comprising the dielectric layer, and an electronic device including a layer that includes grains.

2. Description of the Related Art

State-of-the-art metal-insulator-semiconductor field-effect transistors (MISFETs) require gate dielectric layers having a relatively high dielectric constant ("high-k"). For the purposes of this specification, a high-k material has a dielectric constant higher than silicon nitride, which is approximately seven. One such material is $HfO_2$. A MISFET having an $HfO_2$ gate dielectric layer suffers from a relatively lower mobility of carriers within the MISFET's channel region and degraded reliability.

One attempt to address the shortcomings of an $HfO_2$ gate dielectric layer is to use a laminated gate dielectric layer that includes separate films. A laminated gate dielectric layer typically has an interface between each of the films within the gate dielectric layer. The interface(s) are undesired because they are more likely to have defects, trapped charge, or a combination thereof at the interface(s) as opposed to a gate dielectric layer that is not a laminate.

Another attempt to address the shortcomings of a high-k gate dielectric layer is to include one or more impurities within the gate dielectric layer. An $HfO_2$ layer may include a divalent or a trivalent impurity. Alternatively, $ZrO_2$ layer include the divalent or the trivalent impurity. The divalent or trivalent impurity typically has chemical and physical properties significantly different from hafnium and zirconium. Therefore, adding a divalent or trivalent impurity to $HfO_2$ or $ZrO_2$ is undesired.

Hafnium and zirconium have similar chemical and physical properties. Separating the two from each other can be difficult. Therefore, hafnium typically includes at least trace amounts of zirconium. Such trace amounts can approach 0.067 atomic % Zr when compared to the sum of the hafnium and zirconium atoms present.

BRIEF DESCRIPTION OF THE DRAWINGS

The invention is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

A mixture of materials can be used within a layer of an electronic device to improve electrical and physical properties of the layer. In one set of embodiments, the layer can be a dielectric layer, such as a gate dielectric layer or a capacitor dielectric layer. The dielectric layer can include oxygen, and two or more dissimilar metallic elements. In one specific embodiment, two dissimilar elements may have the same single oxidation state and be miscible within each other. In one embodiment, the dielectric layer can include an alloy of $(HfO_2)_{(1-x)}(ZrO_2)_x$, wherein x has a value between 0 and 1. Each of Hf and Zr has a single oxidation state of +4. Other combinations are possible. Improved electrical and physical properties can include better control over grain size, distribution of grain sizes, thickness of the layer across a substrate, improved carrier mobility, threshold voltage stability, or any combination thereof.

In one embodiment, a dielectric layer includes oxygen, a first metallic element, and a second metallic element different from the first element. The first metallic element has a single oxidation state and an oxidation state value, and the second metallic element has the single oxidation state and the oxidation state value. Within the dielectric layer, a number of first metallic element atoms divided by a sum of the first metallic element atoms and second metallic element atoms is greater than 0.067, and a number of second metallic element atoms divided by the sum of the first metallic element atoms and the second metallic element atoms is greater than 0.067.

In another embodiment, the first and second metallic elements are capable of forming a first metallic oxide and a second metallic oxide, respectively. The first metallic oxide can only have one or more structures selected from a group consisting of a set of structures. The second metallic oxide can only have one or more structures selected from a group consisting of the set of structures. In still another embodiment, the first metallic oxide and the second metallic oxide are substantially miscible with respect to each other. In yet another embodiment, the dielectric layer is a gate dielectric layer.

In a further embodiment, each of the first and second metallic elements is a Group 2 element, a Group 3 element, a Group 4 element, or a Group 5 element. In another further embodiment, the first metallic element is Hf, and the second metallic element is Zr. In a specific embodiment, the dielectric layer consists essentially of O, Hf, and Zr. In another specific embodiment, the dielectric layer further includes Si, Ge, C, N, Al, or any combination thereof. In another specific embodiment, the dielectric layer includes an alloy, wherein the alloy is $(HfO_2)_{(1-x)}(ZrO_2)_x$, wherein x has a value between 0 and 1. In yet a further embodiment, an electronic device includes the dielectric layer.

In one embodiment, a process for forming an electronic device includes forming a dielectric layer over a workpiece. The dielectric layer includes oxygen, a first metallic element, and a second metallic element different from the first element. The first metallic element has a single oxidation state and an oxidation state value, and the second metallic element has the single oxidation state and the oxidation state value. The dielectric layer includes more than 0.067 atomic % of the first metallic element and more than 0.067 atomic % of the second metallic element. The process also includes forming an electrode over the dielectric layer.

In another embodiment, the first and second metallic elements are capable of forming a first metallic oxide and a second metallic oxide, respectively. The first metallic oxide can only have one or more structures selected from a group consisting of a set of structures. The second metallic oxide can only have one or more structures selected from a group consisting of the set of structures.

In still another embodiment, forming the dielectric layer includes depositing the dielectric layer within a chamber. Depositing includes performing a sequence of actions. The sequence of actions include exposing a surface of a workpiece to a precursor while the workpiece is within the chamber, wherein the precursor includes the first and second metallic elements, purging the chamber, exposing the first and second metallic elements to an oxygen-containing species while the workpiece is within the chamber, and purging the chamber. If needed or desired, iterating the sequence of actions at least until a predetermined thickness of the dielectric layer is achieved.

In yet another embodiment, forming the dielectric layer includes depositing the dielectric layer within a chamber. Depositing includes performing a sequence of actions. The sequence of actions includes exposing a surface of a workpiece to a first precursor while the workpiece is within the chamber, wherein the first precursor includes the first metallic element, purging the chamber, exposing the first metallic element to a first oxygen-containing species to form the first metallic oxide, purging the chamber, exposing the first metallic oxide to a second precursor while the workpiece is within the chamber, wherein the second precursor includes the second metallic element; purging the chamber, exposing the second metallic element to an oxygen-containing species, and purging the chamber. If needed or desired, iterating the sequence of actions at least until a predetermined thickness of the dielectric layer is achieved.

In a further embodiment, forming the dielectric layer is performed using atomic layer deposition ("ALD"), chemical vapor deposition ("CVD"), physical vapor deposition ("PVD"), or a combination thereof. In other further embodiment, forming the electrode includes forming a first layer that contacts the dielectric layer, wherein the first layer includes a third metallic element and another element other than Si. In still a further embodiment, the electrode includes a first layer that contacts the dielectric layer, wherein the first layer includes mostly Si or a metal silicide.

In yet a further embodiment, the first metallic element is Hf, and the second metallic element is Zr. In a specific embodiment, the dielectric layer consists essentially of O, Hf, and Zr. In another specific embodiment, the dielectric layer further includes Si, Ge, C, N, Al, or any combination thereof. In still another specific embodiment, the dielectric layer includes an alloy, wherein the alloy is $(HfO_2)_{(1-x)}(ZrO_2)_x$, wherein x has a value between 0 and 1.

In another embodiment, the process further includes forming an interface layer after forming the dielectric layer. The interface layer includes O, Si, the first metallic element, and the second metallic element.

In one embodiment, an electronic device including a first layer that includes grains, wherein the first layer includes a material that is capable of affecting sizes of the grains or a size distribution of the grains, wherein the first layer includes more than 0.067 atomic % of atoms from the material. In another embodiment, the first layer includes at least 10 atomic % oxygen. In a specific embodiment, the first layer further includes a first metallic element, and the material includes a second metallic element. In a more specific embodiment, the first metallic element has a single oxidation state and an oxidation state value, and the second metallic element has the single oxidation state and the oxidation state value. The first and second metallic elements are capable of forming a first metallic oxide and a second metallic oxide, respectively. The first metallic oxide can only have one or more structures selected from a group consisting of a set of structures, and the second metallic oxide can only have one or more structures selected from a group consisting of the set of structures. In a still more specific embodiment, the first layer first metallic oxide and the second metallic oxide are miscible with respect to each other. In a further specific embodiment, each of the first and second metallic elements is a Group 2 element, a Group 3 element, a Group 4 element, or a Group 5 element.

In yet a further specific embodiment, the first metallic element is Hf, and the second metallic element is Zr. In a more specific embodiment, the first layer consists essentially of O, Hf, and Zr. In another more specific embodiment, the first layer further includes Si, Ge, C, N, Al, or any combination thereof. In still another more specific embodiment, the dielectric layer includes an alloy, wherein the alloy is $(HfO_2)_{(1-x)}(ZrO_2)_x$, wherein x has a value between 0 and 1. In a further more specific embodiment, the electronic device further includes a substrate and an interface layer lying between the substrate and the first layer, wherein the interface layer includes O, Si, Hf, and Zr. In another embodiment, the first layer is a gate dielectric layer.

Before addressing details of embodiments described below, some terms are defined or clarified. Group numbers corresponding to columns within the Periodic Table of the elements use the "New Notation" convention as seen in the *CRC Handbook of Chemistry and Physics*, $81^{st}$ Edition (2000).

The term "metal" or any of its variants is intended to refer to a material that includes an element that is within any of Groups 1 to 12, within Groups 13 to 16, an element that is along and below a diagonal line defined by atomic numbers 13 (Al), 32 (Ge), 51 (Sb), and 84 (Po), or any combination thereof. Metal does not include Si. The term "transition metal element" is intended to refer to an element that is within any of Groups 3 to 12.

The term "workpiece" is intended to mean a substrate at any particular point of a process sequence. Note that the substrate may not significantly change during a process sequence, whereas the workpiece significantly changes during the process sequence. For example, at a beginning of a process sequence, the substrate and workpiece are the same. After layer is formed over the substrate, the substrate has not changed, but now the workpiece includes the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts.

Other features and advantages of the invention will be apparent from the following detailed description, and from the claims.

Figure 1:
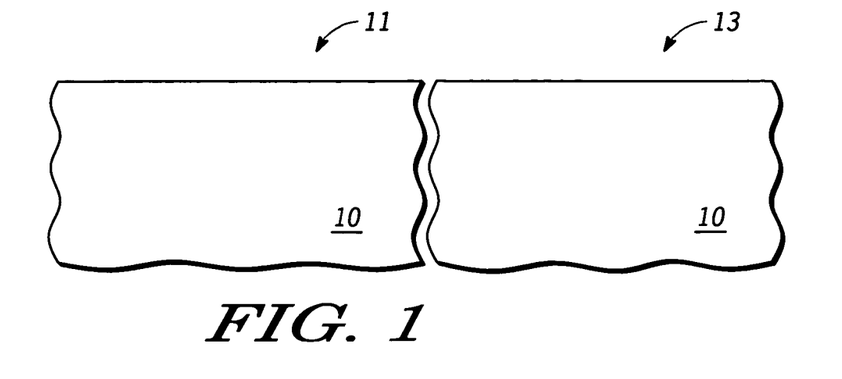
FIG. 1 includes an illustration of cross-sectional views of portions of a semiconductor device substrate.

FIG. 1 includes an illustration of cross-sectional views of a PMOS portion 11 and an NMOS portion 13 of a substrate 10. The substrate 10 can include a monocrystalline semiconductor material, a semiconductor-on-insulator substrate, or nearly any other substrate used in forming semiconductor devices. Within the PMOS portion 11, the substrate 10 may include an n-type impurity, and within the NMOS portion 13, the substrate 10 may include a p-type impurity. In another embodiment, the conductivity types for the impurities may be reversed or may be the same.

Figure 2:
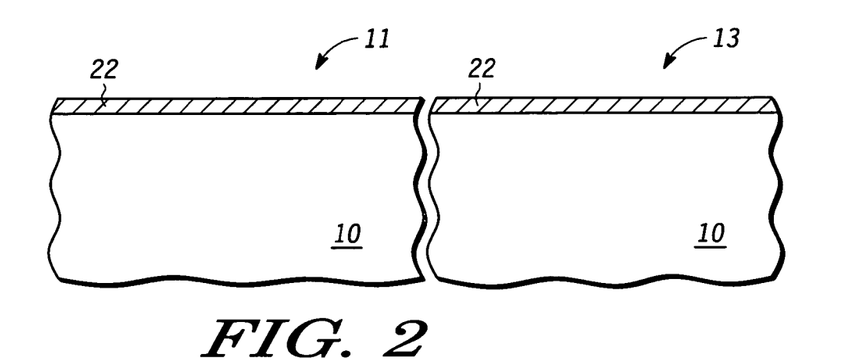
FIG. 2 includes an illustration of cross-sectional views of the semiconductor device substrate of FIG. 1 after forming a high-k gate dielectric layer in accordance with an embodiment of the present invention.

A gate dielectric layer is formed over the substrate 10 within the PMOS and NMOS portions 11 and 13 as illustrated in FIG. 2. In one embodiment, the gate dielectric layer 22 has a thickness no greater than approximately 10 nm, and in a specific embodiment, in a range of approximately 0.8 to 5 nm. The gate dielectric layer 22 may have one or more characteristics as described below.

In one embodiment, the gate dielectric layer 22 includes oxygen, a first metallic element, and a second metallic element different from the first element. Although not required, such a gate dielectric layer may exhibit any one or more of the following characteristics. Each of the first and second metallic elements can have a single oxidation state and an oxidation state value. Referring to the Periodic Table, Hf and Zr have only one oxidation state and oxidation state value, namely +4. Other combinations of metallic elements can be used, such as Group 2 elements, Group 3 elements, Group 4 elements, or Group 5 elements. In addition to the Hf—Zr combination, other exemplary combinations can include Sr—Ba and Sc—Y.

The content of the second metallic element within the gate dielectric layer 12 can be characterized by Equation 1, which is unitless.

$$\frac{SME}{(FME + SME)},\qquad \text{Equation 1}$$

wherein:
FME is the amount of the first metallic element within the gate dielectric layer 12; and
SME is the amount of the second metallic element within the gate dielectric layer 12.

Within the gate dielectric layer 12 and using Equation 1, the number of first metallic element atoms divided by a sum of the first metallic element atoms and second metallic element atoms is greater than 0.0017, and the number of second metallic element atoms divided by the sum of the first metallic element atoms and the second metallic element atoms is greater than 0.0017. In one specific embodiment, the Zr is at a content greater than 0.0017 when the Hf—Zr combination is used (FME is Hf, and SME is Zr). At this content level, the relative amount of Zr present is higher than what inherently occurs with Hf (due to difficulty in separating the two elements).

Optionally, each of the oxides from the first and second metallic elements may only have one or more structures selected from a group consisting of a set of structures. More specifically, $HfO_2$ can only have monoclinic, tetragonal, and cubic structures. Similarly, $ZrO_2$ can only have monoclinic, tetragonal, and cubic structures, too. Each of $HfO_2$ and $ZrO_2$ do not form any other stable structures other than those three structures. Cubic structures include simple cubic, body-centered cubic, face-centered cubic, or any combination thereof.

In another embodiment, the oxides can be substantially miscible with respect to each other. When the oxides are substantially miscible, they stay in one phase and do not separate into different phases. The gate dielectric layer 22 includes a substantially homogeneous alloy. In one specific embodiment, the alloy is $(HfO_2)_{(1-x)}(ZrO_2)_x$, wherein x has a value between 0 and 1.

The gate dielectric layer 22 may optionally include one or more additional elements. Exemplary elements include Si, Ge, C, N, Al, and the like.

The gate dielectric layer 22 can be formed using ALD, CVD (e.g., metal organic chemical vapor deposition), PVD (e.g., sputtering), or the like. For ALD and CVD, the precursors for the gate dielectric layer 22 can depend on the elements to be incorporated into the gate dielectric layer 22, the method of formation, one or more formation conditions, or a combination thereof. Each of the precursors for the first and second metallic elements can include hydrogen, a halogen (e.g., Cl, Br, I), or any combination thereof. An exemplary precursor includes $HfBr_4$, $HfC_4$, $ZrBr_4$, $ZrC_4$, or the like. For MOCVD, the precursors may include metal element(s) one or more additional or other elements (e.g., C, H, O, etc.). Each of the precursors may be maintained in a separate container. Alternatively, two or more of the precursors may be mixed within a single container.

In one embodiment, ALD is used to form the gate dielectric layer. $HfCl_4$ and $ZrCl_4$ precursors are mixed into a single container that will be used to deposit the gate dielectric layer. Alternatively, a Hf—Zr—Cl compound can be used. ALD can be carried out within a chamber. The deposition temperature is typically in a range of approximately 25 to 950° C., and in a specific embodiment is in a range of approximately 100–500° C. The deposition pressure is typically no greater than atmospheric pressure, and in a specific embodiment is at a pressure no greater than 10 Torr. Other operating parameters are conventional.

For the mixed-precursors embodiment, a first sequence of actions is used to form a monolayer of the first and second metallic oxides. The precursors are exposed to the substrate 10 while the substrate 10 is within the chamber. During the exposure, a monolayer of the first and second metallic elements (e.g., Hf and Zr) is deposited over the primary surface of the substrate 10. The monolayer may or may not contact the primary surface of the substrate 10. The relative proportion of the first metallic element to the second metallic element within the monolayer is substantially the same as the relative proportion of the two within the precursor mixture within the single container. After the monolayer has been formed, the chamber is purged.

The first and second metallic elements are exposed to an oxygen-containing species while the substrate 10 is within the chamber. The oxygen-containing species can include $O_2$, $O_3$, $H_2O$, heavy water (includes at least one deuterium atom), $H_2O_2$, $HDO_2$, $D_2O_2$, NO, $N_2O$, another oxidizing gas, or any combination thereof, wherein D is a deuterium atom.

The oxygen-containing species oxidizes the first and second metallic elements to form their corresponding oxides. When the precursors include Hf and Zr, the corresponding oxides are $HfO_2$ and $ZrO_2$, respectively. If other metallic elements were used, their metallic oxides would be formed during the exposure to the oxygen-containing species. After the oxidation has been performed, the chamber is purged.

At the point in the process, at least part of the gate dielectric layer 14 is formed over the PMOS and NMOS portions 11 and 13 of the substrate. If a thicker gate dielectric layer 22 is needed or desired, the first sequence of actions is iterated until at least a predetermined thickness of the gate dielectric layer 22 is achieved.

In another embodiment, different precursors are maintained in separate containers. For the separate precursors embodiment, a second sequence of actions is used to form monolayers of the first and second metallic oxides. The first precursor including the first metallic element is exposed to the substrate 10 while the substrate 10 is within the chamber. During the exposure, a monolayer of the first metallic element (e.g., Hf) is deposited over the primary surface of the substrate 10. The monolayer may or may not contact the primary surface of the substrate 10. After the monolayer has been formed, the chamber is purged.

The first metallic element is exposed to an oxygen-containing species while the substrate 10 is within the chamber. The oxygen-containing species oxidizes the first metallic element to form its corresponding oxide. When the first precursor includes Hf, its corresponding oxide is $HfO_2$. This oxidation is performed substantially the same as previously described with respect to the mixed-precursor embodiment. After the oxidation has been performed, the chamber is purged. At this point in the process, the workpiece includes the substrate 10 and a monolayer of $HfO_2$.

The second precursor including the second metallic element is exposed to the workpiece while the workpiece is within the chamber. During the exposure, a monolayer of the second metallic element (e.g., Zr) is deposited over the workpiece. After the monolayer has been formed, the chamber is purged.

The second metallic element is exposed to an oxygen-containing species while the workpiece is within the chamber. The oxygen-containing species oxidizes the second metallic element to form its corresponding oxide. When the second precursor includes Zr, its corresponding oxide is $ZrO_2$. This oxidation is performed substantially the same as previously described with respect to the mixed-precursor embodiment. After the oxidation has been performed, the chamber is purged.

At the point in the process, at least part of the gate dielectric layer 22 is formed over the PMOS and NMOS portions 11 and 13 of the substrate 10 and includes the $HfO_2$ and $ZrO_2$. While not meant to limit the scope of the invention, $HfO_2$ can be formed before the $ZrO_2$ to reduce the likelihood of forming $ZrSi_2$, which is undesired. If a thicker gate dielectric layer 22 is needed or desired, the second sequence of actions is iterated until at least a predetermined thickness of the gate dielectric layer 22 is achieved.

In another embodiment, additional elements may be used. The other elements can be introduced in a manner similar to the prior embodiments (mixed precursors or separate precursors). In this matter other elements (e.g., Si, Ge, C, N, Al, or any combination thereof) can be added to the gate dielectric layer 22 during its formation.

Alternatively, the gate dielectric layer 22 can be formed using PVD. In one embodiment, a target having a composition that is substantially the same as the desired composition of the gate dielectric layer 22 is used. Material from the target is transferred to the substrate 22 until the desired thickness of the gate dielectric layer 22 is achieved. Other than the composition of the target, all other deposition parameters are conventional.

As deposited, the gate dielectric layer 22 can be amorphous. The workpiece, including the substrate 10 and gate dielectric layer 22 may receive an optional oxidizing anneal. The anneal can be performed using an oxygen-containing species at a temperature in a range of approximately 300 to 1000° C. for a time in a range of approximately 20 to 120 seconds. Note that a subsequent source/drain anneal may be performed later, and therefore, a separate oxidizing anneal immediately after formation of the gate dielectric layer 22 is not required. During the optional oxidation anneal or subsequent source/drain anneal, part or all of the material within the gate dielectric layer 22 may become polycrystalline. Therefore, part of the gate dielectric layer may or may not be amorphous. Also, the gate dielectric layer 22 may have one or a combination of crystal structures. In a finished electronic device, the gate dielectric layer 22 can be amorphous, can include one or more crystalline structures, or any combination thereof. In a specific embodiment using an $HfO_2$—$ZrO_2$ alloy, the gate dielectric layer 22 can be partly or substantially completely amorphous, can have partly or substantially completely one or more monoclinic crystals, can have partly or substantially completely one or more tetragonal crystals, can have partly or substantially completely one or more cubic crystals, or any combination thereof.

Figure 3:
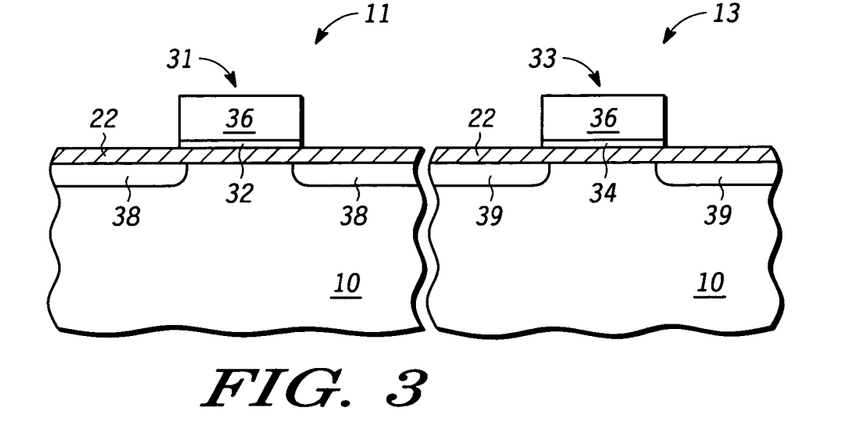
FIG. 3 includes an illustration of cross-sectional views of the semiconductor device substrate of FIG. 2 after forming gate electrodes and source/drain regions.

First and second gate electrodes 31 and 33 are formed over the gate dielectric layer 22 within the PMOS and NMOS portions 11 and 13, respectively, of the substrate 10, as illustrated in FIG. 3. In one embodiment, the first gate electrode 31 includes a first layer 32 and a conductive layer 36, and the second gate electrode 33 includes a second layer 34 and the conductive layer 36. The work function of the first and second gate electrodes 31 and 33 are principally determined by the composition of the layers of the gate electrodes 31 and 33 lying closest to the gate dielectric layer 22, which in this embodiment are the first layer 32 within the PMOS portion 11 and the second layer 34 within the NMOS portion 13. In one specific embodiment, the first layer 32 includes TiN, and the second layer includes TaSiN or TaC. One or more different materials may be used in place of or in conjunction with TiN, TaSiN, or both. The material(s) may or may not be in their stoichiometric ratios. In another embodiment, the same material may be used for both the first and second layers 32 and 34. After reading this specification, skilled artisans will be able to use one or more materials for the first layer 32 and the second layer 34 to achieve a designed or desired work function. In one specific embodiment, each of the first and second layers 32 and 34 has a thickness in a range of approximately 5 to 20 nm.

The conductive layer 36 is designed to provide good conductivity and still be able to withstand the highest temperature to which the workpiece will be subsequently exposed. In one embodiment, that highest temperature occurs during a subsequent source/drain anneal. In the embodiment as illustrated in FIG. 3, a principal function of the conductive layer 36 is to provide a low-resistance pathway for charge carriers; it does not set the work function for the transistors. The conductive layer 36 can include doped silicon (amorphous or polycrystalline), a refractory metal, a refractory metal silicide, a noble metal, or any combination thereof. The conductive layer 36 has a thickness of at least 10 nm, and in a specific embodiment, has a thickness in a range of approximately 50 to 150 nm. The conductive layer 36 is formed using one or more conventional deposition techniques, and optionally, may include a conventional anneal or silicide reaction heat cycle.

The first layer 32 and conductive layer 36 are patterned using a conventional technique to form the first gate electrode 31. The second layer 34 and conductive layer 36 are patterned using a conventional technique to form the second gate electrode 32. $P^+$ source/drain regions 38 are formed within the PMOS portion 11, and $N^+$ source/drain regions 39 are formed within the NMOS portion 13. The impurity concentration within the $P^+$ and $N^+$ source/drain regions 38 and 39 is at least 1E19 atoms/cm$^3$ to allow ohmic contacts to be formed to those regions. The impurity incorporation can be performed using a conventional technique, such as ion implantation or a furnace operation. The workpiece, including the $P^+$ and $N^+$ source/drain regions 38 and 39, is annealed to activate the impurities within the PMOS 11 and NMOS 13 portions of the substrate 10. This anneal is conventional and may be performed at a temperature that is the same or higher than the optional oxidizing anneal previously described. In one embodiment, the source/drain anneal can be performed at a temperature in a range of approximately 500 to 1100° C.

In another embodiment, the conductive layer 36 may be deposited as an undoped silicon layer that later becomes doped when the $P^+$ and $N^+$ source/drain regions 38 and 39 are formed. This doping and subsequent annealing will make the silicon layer, now doped and activated, conductive to form the conductive layer 36.

Although not illustrated, one or more insulating layers and one or more wiring layers are formed over the workpiece after the PMOS and NMOS transistors have been formed. A passivation layer and an optional alpha particle protection layer (e.g., polyimide) are deposited to form a substantially completed electronic device. Such layers and their processes for formation are conventional to skilled artisans.

An interface layer (not illustrated) may be formed and lie between the substrate 10 and gate dielectric layer 22. The interface layer can include a combination of elements from the substrate 10 and the gate dielectric layer 22, such as Si, O, the first metallic element and the second metallic element. In one embodiment, the interface layer includes Si, O, Hf, and Zr. In another embodiment, the interface layer can also include nitrogen. The thickness can be in a range of approximately 0.2 to 2 nm. The interface layer may be formed during one or more heat cycles before, during, or after forming the gate dielectric layer 22. Therefore, the interface layer may be formed or become thicker during the optional oxidizing anneal, during the source/drain anneal, or a combination thereof.

Embodiments described herein have similar electronic properties and significantly smaller distributions (e.g., ranges, standard deviations, etc.) of those electronic properties. For example, thickness uniformity across a substrate is improved. Additionally, in one embodiment, carrier mobility within the channel region of a MISFET can increase by approximately 20%. Even higher carrier mobility is possible other embodiments. Threshold voltage ($V_t$) stability can improve by approximately 3 times. Even better $V_t$ stability is possible other embodiments. The band gap of the dielectric layer will be between the band gaps of the individual oxides within the dielectric layer. For example, a dielectric layer that includes an alloy of $(HfO_2)_{(1-x)}(ZrO_2)_x$, wherein x is between 0 and 1, will have band gap that has a value between the band gap for $HfO_2$ and $ZrO_2$.

Although the cause of the smaller distributions is not known or scientifically proven, better control over the sizes of the grains or the size distribution of the grains may have an effect. As compared to a first metallic oxide that includes the first metallic element, the second metallic oxide may be a material that is capable of affecting the sizes of the grains or a size distribution of the grains. The concentration of the second metallic oxide would be in an amount greater than would inherently occur when forming the first metallic oxide. The additional material (i.e., second metallic oxide) may provide additional nucleation sites that help to increase the ratio of the nucleation rate for grain formation within the dielectric layer to the growth rate of the grains within the dielectric layer. The relatively higher nucleation rate compared to the growth rate is believed to cause smaller and uniform grains.

Figure 4:
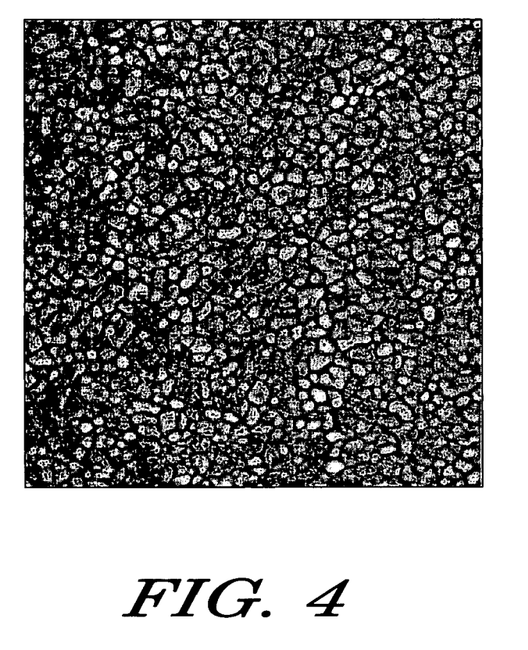
FIG. 4 includes a picture of an $HfO_2$ layer when the Zr content is at approximately 0.0067 atomic %.
Figure 5:
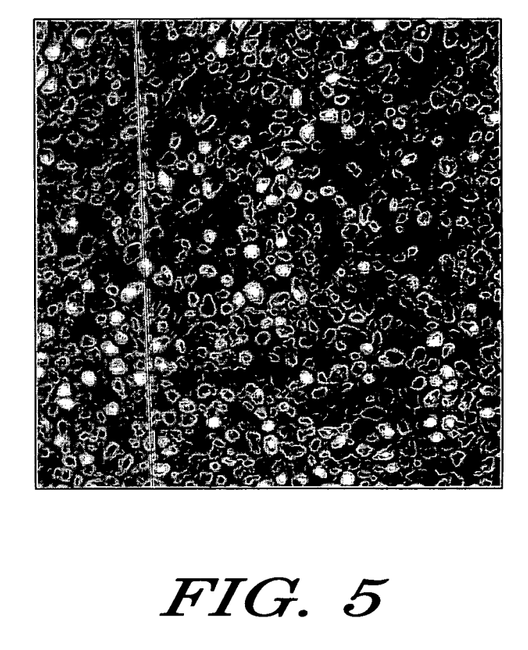
FIG. 5 includes a picture of an $HfO_2$ layer when the Zr content at approximately 5.6 atomic %.

In one specific embodiment, an $HfO_2$ layer can be formed over a substrate. The $HfO_2$ layer has different amounts of $ZrO_2$ within it. As previously described, even after purification, Hf may include up to 0.0017 Zr (as calculated using Equation 1 above). When the $HfO_2$ layer includes 0.0067 atomic % or less of Zr, the average grain size is 35.5 nm with a standard deviation of 15.5 nm. When the $HfO_2$ layer includes 5.6 atomic % of Zr, the average grain size is 28.6 nm with a standard deviation of 9.6 nm. As can be seen from the data, the increasing $ZrO_2$ concentration decreases the average grain size and standard deviation of the gram sizes. FIG. 4 includes a picture of an $HfO_2$ layer when the Zr content is at approximately 0.0067 atomic %, and FIG. 5 includes a picture of an $HfO_2$ layer when the Zr content is at approximately 5.6 atomic %. The pictures in FIGS. 4 and 5 demonstrate that increased Zr content decreases the average grain size and standard deviation of the grain sizes.

The discussion regarding the average grain size and standard deviation of the grain sizes addresses Hf—Zr combinations. Other combinations, such as Sr—Ba, Sc—Y, etc. may be similarly affected when used as dielectric layers, which typically includes at least 10 atomic % oxygen. The concepts may be extended to other thin films used in electronic devices, including conductive layers that may or may not contain a significant amount of oxygen. When used with conductive layers, the average grain size may be increased or decreased by adding or removing materials. Therefore, controlling average grain size and standard deviation of the grain sizes may affect a variety of different layers and is not limited to gate dielectric layers.

In another embodiment, the Zr content can be graded. Within the gate dielectric layer 22, the Zr content increases with increasing distance from the substrate 10. The increase in Zr content within the gate dielectric layer may increase in a linear or non-linear manner (e.g. asymptotically, exponentially, or as a step function.)

In still another embodiment, a capacitor structure may be formed. A first electrode can replace or lie along the surface of the substrate 10. A capacitor dielectric layer can be formed in a manner substantially similar to the gate dielectric layer. A second electrode can be formed over the capacitor dielectric layer to form the capacitor structure. The formation of the first and second electrodes is conventional.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. An electronic device comprising:
    a gate dielectric layer comprising:
        oxygen;
        a first metallic element; and
        a second metallic element different from the first element,
        wherein;
            the first metallic element has a single oxidation state and an oxidation state value;
            the second metallic element has the single oxidation state and the oxidation state value;
            within the dielectric layer, a number of first metallic element atoms divided by a sum of the first metallic element atoms and second metallic element atoms is greater than 0.067; and
            within the dielectric layer, a number of second metallic element atoms divided by the sum of the first metallic element atoms and the second metallic element atoms is greater than 0.067;
    a first gate electrode within a PMOS portion of the electronic device; and
    a second gate electrode within an NMOS portion of the electronic device, wherein a composition of the second gate electrode is different from a composition of the first gate electrode.

2. The electronic device of claim 1, wherein:
    the first and second metallic elements are capable of forming a first metallic oxide and a second metallic oxide, respectively;
    the first metallic oxide can only have one or more structures selected from a group consisting of a set of structures; and
    the second metallic oxide can only have one or more structures selected from a group consisting of the set of structures.

3. The electronic device of claim 1, wherein the first metallic oxide and the second metallic oxide are substantially miscible with respect to each other.

4. The electronic device of claim 1, wherein the first metallic element is Hf, and the second metallic element is Zr.

5. The process of claim 1, wherein the gate dielectric layer comprises an alloy, wherein the alloy is $(M1_yO_z)_{(1-x)}(M2_yO_z)_x$, wherein:
    M1 is the first metallic element;
    M2 is the second metallic element;
    x has a value between 0 and 1; and
    y and z are integer values for a stoichiometric compound.

6. A process for forming an electronic device comprising:
    forming a dielectric layer over a workpiece using an atomic layer deposition, wherein:
        the dielectric layer comprises:
            oxygen;
            a first metallic element; and
            a second metallic element different from the first element,
            wherein:
                the first metallic element has a single oxidation state and an oxidation state value; and
                the second metallic element has the single oxidation state and the oxidation state value,
        the dielectric layer comprises more than 0.067 atomic % of the first metallic element; and
        the dielectric layer comprises more than 0.067 atomic % of the second metallic element; and
    forming an electrode over the dielectric layer.

7. The process of claim 6, wherein:
    the first and second metallic elements are capable of forming a first metallic oxide and a second metallic oxide, respectively;
    the first metallic oxide can only have one or more structures selected from a group consisting of a set of structures; and
    the second metallic oxide can only have one or more structures selected from a group consisting of the set of structures.

8. The process of claim 6, wherein forming the dielectric layer comprises depositing the dielectric layer within a chamber, wherein depositing comprises:
    performing a sequence of actions comprising:
        exposing a surface of a workpiece to a precursor while the workpiece is within the chamber, wherein the precursor comprises the first and second metallic elements;
        purging the chamber;
        exposing the first and second metallic elements to an oxygen-containing species while the workpiece is within the chamber;
        purging the chamber; and
        if needed or desired, iterating the sequence of actions at least until a predetermined thickness of the dielectric layer is achieved.

9. The process of claim 6, wherein forming the dielectric layer comprises depositing the dielectric layer within a chamber, wherein depositing comprises:
    performing a sequence of actions comprising:
        exposing a surface of a workpiece to a first precursor while the workpiece is within the chamber, wherein the first precursor comprises the first metallic element;
        purging the chamber;
        exposing the first metallic element to a first oxygen-containing species to form the first metallic oxide;
        purging the chamber; and exposing the first metallic oxide to a second precursor while the workpiece is within the chamber, wherein the second precursor comprises the second metallic element;

purging the chamber;

exposing the second metallic element to an oxygen-containing species;

purging the chamber; and if needed or desired, iterating the sequence of actions at least until a predetermined thickness of the dielectric layer is achieved.

10. The process of claim 6, wherein the first metallic element is Hf, and the second metallic element is Zr.

11. The process of claim 10, wherein the dielectric layer comprises an alloy, wherein the alloy is $(HfO_2)_{(1-x)}(ZrO_2)_x$, wherein x has a value between 0 and 1.

12. The process of claim 6, wherein the dielectric layer comprises an alloy, wherein the alloy is $(M1_yO_z)_{(1-x)}(M2_yO_z)_x$, wherein:

M1 is the first metallic element;

M2 is the second metallic element;

x has a value between 0 and 1; and y and z are integer values for a stoichiometric compound.

13. An electronic device comprising:

a gate dielectric layer that includes grains, wherein:
  the gate dielectric layer comprises a material that is capable of affecting sizes of the grains or a size distribution of the grains, wherein the gate dielectric layer comprises more than 0.067 atomic % of atoms from the material;
  the material comprises Zr; and
  the gate dielectric layer further comprises Hf; and a first gate electrode within a PMOS portion of the electronic device; and a second gate electrode within an NMOS portion of the electronic device, wherein a composition of the second gate electrode is different from a composition of the first gate electrode.

14. The electronic device of claim 13, wherein the gate dielectric layer comprises at least 10 atomic % oxygen.

15. The electronic device of claim 14, wherein:

the first metallic element has a single oxidation state and an oxidation state value;

the second metallic element has the single oxidation state and the oxidation state value;

the first and second metallic elements are capable of forming a first metallic oxide and a second metallic oxide, respectively;

the first metallic oxide can only have one or more structures selected from a group consisting of a set of structures; and the second metallic oxide can only have one or more structures selected from a group consisting of the set of structures.

16. The electronic device of claim 15, wherein the gate dielectric layer first metallic oxide and the second metallic oxide are miscible with respect to each other.

17. The electronic device of claim 14, further comprising:

a substrate; and an interface layer lying between the substrate and the gate dielectric layer, wherein the interface layer comprises O, Si, Hf, and Zr.

18. The electronic device of claim 13, wherein the gate dielectric layer consists essentially of O, Hf, and Zr.

19. The electronic device of claim 13, wherein the gate dielectric layer further comprises Si, Ge, C, N, Al, or any combination thereof.

20. The electronic device of claim 13, wherein the gate dielectric layer comprises an alloy, wherein the alloy is $(HfO_2)_{(1-x)}(ZrO_2)_x$, wherein x has a value between 0 and 1.

* * * * *